331-98

SEARCH ROOM

Nov. 2, 1954

J. C. REED, JR 2,693,538

OSCILLATOR

Filed Feb. 15, 1946

INVENTOR.
JOHN CHARLES REED JR.
BY
M.A. Hayes
ATTORNEY

United States Patent Office 2,693,538

Patented Nov. 2, 1954

2,693,538

OSCILLATOR

John C. Reed, Jr., North Hollywood, Calif., assignor, by mesne assignments, to the United States of America as represented by the Secretary of the Navy Application February 15, 1946, Serial No. 647,958

5 Claims. (Cl. 250—36)

This invention relates to high frequency oscillators and more specifically to grid-cathode type cavity oscillators.

In a grid-cathode type cavity oscillator the cathode cavity is of comparatively lower Q than that of the grid circuit which makes it necessary to change the resonance of the grid circuit to tune the oscillator over any substantial frequency range. To do this the grid tuned line must be effectively changed in length, and to maintain the efficiency of the oscillator the cathode cavity resonance must be correspondingly changed to track in frequency with the grid element. The grid tuned circuit is formed by a conductive cylindrical sleeve which extends from the grid connection (usually circular) of the oscillator tube. The tuning can be effected by actually changing the length of the grid sleeve. However, the tracking problem, mechanical complexities, and the power loss due to necessary insulating elements inserted to support the tuning elements make this means impractical.

In accordance with the general principles of this invention, a capacity is inserted between an end of the grid sleeve and cathode resonant line. This capacity is thereby effectively connected between the grid and the effective inductance that is part of the cathode resonant circuit. By tuning the cathode circuit, the grid sleeve through this capacity coupling, is automatically tuned, making it possible to tune over a broad range with a single tuning adjustment.

It is thus an object of this invention to provide a grid-cathode type cavity oscillator using a capacity coupling between grid and cathode to tune the grid circuit over a wide range.

A further object of this invention is to provide a stable grid-cathode type cavity oscillator using only a single tuning control to vary its frequency over a wide range with substantially constant power output.

These and other objects will be apparent from the following specification when taken with the accompanying drawing in which.

Figure 1A:
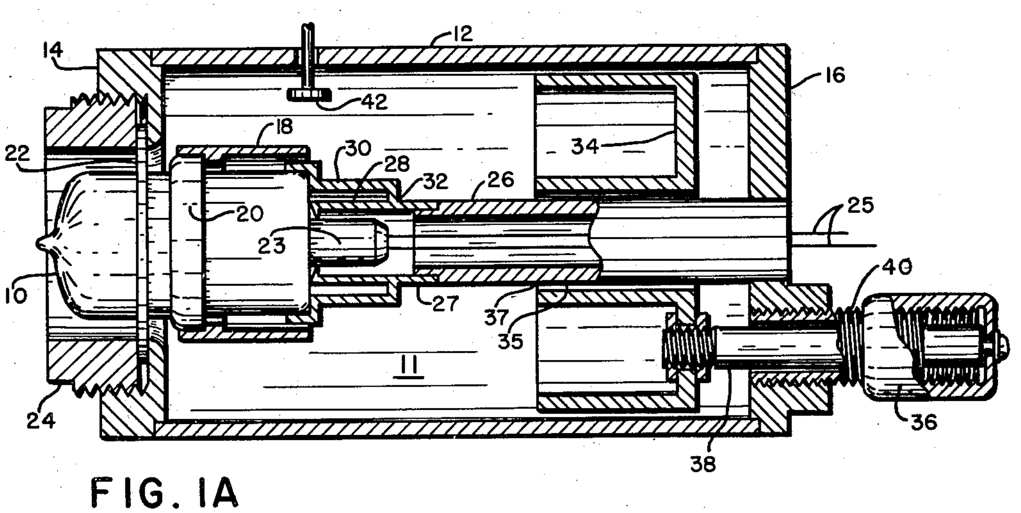
Fig. 1A is a detailed longitudinal cross sectional diagram of a cylindrical cavity with oscillator tube in place.

The invention will now be described in detail with reference to Fig. 1A. A high frequency triode type tube such as tube 10 is used as the oscillator tube in this circuit. As is well known, this type of high frequency triode, sometimes called a "coplanar" tube, has a plane grid which extends through the glass envelope to form a circular metal grid connection 20. For the tube shown, the plate also is plane and extends from plate connector 22. The cathode external connector is ring 23. Heater leads 25 enter the tube 10 at its base. A coaxial cylindrical conductor 12 with end plates 14 and 16 forms a cylindrical resonant cavity 11 in which the tube 10 is mounted. Another coaxial cylindrical conductor 18 one half wave length long ($\lambda/2$) is fitted snugly over the grid connector ring 20 which circumvents the tube 10. Threaded plug 24 holds the plate connector ring 22 in contact with the tapped end plate 14 over its circumference as shown. Coaxial cylindrical conductor 26 and the conducting cylindrical clip 28, these two being joined at the shoulder 27 of conductor 26, form the cathode resonant line of the oscillator which is preferably three quarters ($3\lambda/4$) long. Circular clip ring 30 integral with circular clip 28, and connected thereto at circumference 32, extends under the grid sleeve 18 and provides capacity coupling between the coaxial grid conductor 18 and coaxial cathode conductor 26.

Cathode line 26, of which circular clip 28 is a part, is effectively terminated in an open circuit at a distance substantially one half wave length ($\lambda/2$) from cathode 23 by a tuning choke 34. Tuning choke 34 is a hollow cylindrical piston one quarter of a wave length ($\lambda/4$) long axially closed at one end and having a hollow sleeve 35 in the center, thereof, which passes over coaxial cathode sleeve 26. Choke 34 is held in the cavity 11 by bolt 38 and is movable axially in the cavity by means of the vernier tuning knob 36 which turns on the threaded shaft 40 which in turn is fastened to the end plate 16. Energy is coupled out of the cavity 11 by probe 42 to a load (not shown).

Figure 1B:
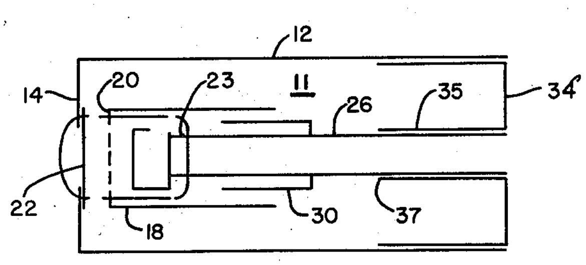
Fig. 1B is a simplified sketch showing the basic required circuit elements of the oscillator shown in Fig. 1A.

The structural features described in detail in connection with Fig. 1A are represented in Fig. 1B, which is a simplified sketch of the oscillator, with the corresponding parts numbered similarly. Grid sleeve 18 is one half wave length long and being open at the end acts as a tuned circuit as represented by inductance 50 and capacitor 51 in equivalent circuit Fig. 2A. The tuning choke 34 is one quarter wave length ($\lambda/4$) deep and being shorted at one end terminates the cathode sleeve 26 in an open circuit at point 37 one half wave length ($\lambda/2$) from the tube cathode 23. Although choke 34 in Figs. 1A and 1B does not quite contact the coaxial cylindrical conductors 12 and 26 there is sufficient capacity coupling between them to form an equivalent electrical short circuit between them. Thus the short at the closed end of choke 34, Fig. 1B, constitutes an open circuit at point 37 as stated above. Cathode sleeve 26 is three quarters of a wave length ($3\lambda/4$) long but since it is terminated in an open circuit at 37 it acts as an open circuited one half wave length ($\lambda/2$) line. It appears as a tuned circuit represented by inductance 52 and capacitor 53 in Fig. 2A. The sleeve 30 connecting to cathode line 26 serves, as previously mentioned, as a coupling capacity between grid and cathode circuits. This is represented by capacitor 54 in Fig. 2A, connected from the end of the grid tank made up of inductance 50 and capacitor 51 to the point between inductance 52*a* and 52*b* in the cathode tank made up of inductance 52 and capacitor 53.

Figure 2A:
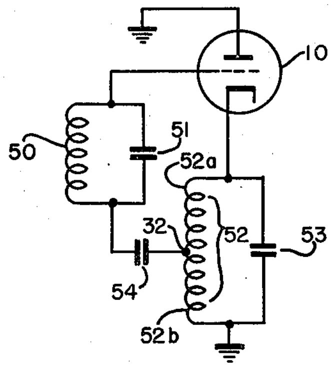
Fig. 2A is an equivalent R-F circuit of the oscillator shown in the above figures.
Figure 2B:
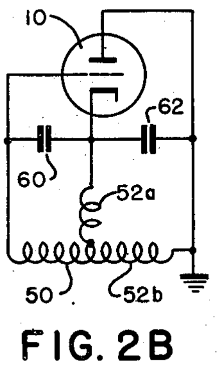
Fig. 2B is a simplified R-F equivalent circuit of the oscillator shown in the above figures.

Thus, the circuit of Fig. 2A shows the R-F equivalent, without interelectrode tube capacities, of the oscillator shown in Figs. 1A and 1B. Fig. 2B shows the R-F equivalent circuit of Fig. 2A, with interelectrode capacities included, and has been considerably simplified. Capacitor 60 represents the grid to cathode capacitance of the tube 10 and the capacitance 51, Fig. 2A, combined, capacitor 62 represents the plate to cathode capacitance of tube 10 with capacitance 53 of the cathode resonant tank in parallel with it. Inductance 50 corresponds to the inductance 50 of the grid circuit, and inductance 52*a* and 52*b* correspond with the same parts 52*a* and 52*b* of inductance 52 shown in Fig. 2A. Capacitor 54, Fig. 2A, represents only the coupling capacitance, between grid and cathode circuits and does not appear in the equivalent R-F diagram of Fig. 2B. It may be seen that this simplified equivalent circuit is similar to ordinary tuned-grid tuned-cathode oscillators. An important feature illustrated in Fig. 2B is that as the tuning choke 34 (Fig. 1A) is moved the inductances 52*a* and 52*b* will change, and therefore the portion 52*a* which is common to both grid and cathode tank circuits will vary and effectively change the total inductance in the grid circuit to tune the grid circuit of the oscillator. This is made possible by the capacitive coupling sleeve 30 in Figs. 1A and 1B which has been incorporated in the oscillator. Thus by changing the tuning choke 34 in Fig. 1 the grid circuit is tuned and at the same time the cathode circuit tracks with this change in frequency. This permits the simple mechanical tuning arrangement illustrated, there being only one adjustment, to tune and match the oscillator. It has been observed that the frequency of oscillation could uniformly and continuously be varied by 10% of the normal frequency, this figure being considerable for the high frequencies employed. The output power variation was observed to be less than 20% of maximum throughout this tuning range.

It is believed that the construction and operation as well as the advantages of my improved cavity oscillator will be apparent from the foregoing detailed description thereof. It will also be apparent that while I have shown and described my invention in a preferred form, changes may be made in the circuit disclosed without departing from the spirit of the invention as sought to be defined in the following claims.

What is claimed is:

1. A cavity type oscillator including a triode tube having a cathode, a control grid, and an anode, an outer coaxial cylindrical conductor connected to said plate of said triode tube, a first coaxial cylindrical inner conductor connected to said grid of said triode tube, a second coaxial cylindrical inner conductor connected to said cathode of said triode tube, means including a third coaxial cylindrical inner conductor connected to said second coaxial cylindrical conductor and extending inside said first coaxial cylindrical conductor for electrically coupling said second coaxial cylindrical conductor to said first coaxial cylindrical conductor, and means for varying the effective length of said second coaxial cylindrical conductor to tune said oscillator, said last mentioned means effectively varying said grid circuit tuning.

2. A cavity type oscillator including a triode tube having a cathode, a control grid, and an anode, an outer coaxial cylindrical conductor connected to said plate of said triode tube, a first coaxial cylindrical inner conductor connected to said grid of said triode tube, a second coaxial cylindrical inner conductor connected to said cathode of said triode tube, a third coaxial cylindrical inner conductor connected to said second coaxial cylindrical conductor and extending within said first coaxial cylindrical conductor, means including a movable piston for varying the effective electrical length of said second coaxial cylindrical conductor and means employing said third coaxial cylindrical conductor for simultaneously changing the effective electrical length of said first coaxial cylindrical conductor to vary the frequency of the oscillator without substantially varying the power output.

3. A cavity type oscillator including a high frequency triode tube having a cathode, a control grid, and an anode, an outer coaxial cylindrical conductor connected to said plate of said triode tube, said triode tube being disposed within said outer cylindrical conductor, a first coaxial cylindrical inner conductor substantially one half wave length long connected to said grid of said triode tube, a second coaxial cylindrical inner conductor substantially three quarters of a wave length long connected to said cathode of said triode tube, a third coaxial cylindrical inner conductor connected to said second coaxial cylindrical conductor at a predetermined distance from the end of said second conductor and extending within said first coaxial cylindrical conductor capacitively coupling said triode grid and said triode cathode, and means employing a movable plunger substantially one quarter wave length long between said outer and said second inner cylindrical conductors for tuning said cavity type oscillator, said oscillator being tunable over a substantial frequency range with substantially constant power output.

4. A grid-cathode type re-enterant cavity oscillator comprising a high frequency electron tube having a cathode, a control grid, and an anode, an outer cylindrical conductor connected to said anode and having conductive end plates to form a resonant cavity, a first coaxial inner cylindrical conductor substantially one half wave length long connected to said grid, a second coaxial cylindrical inner conductor substantially one half wave length effective electrical length connected to said cathode, a third coaxial cylindrical inner conductor attached to said second coaxial cylindrical conductor at a predetermined distance from the end of said second conductor and extending within said first coaxial cylindrical conductor to couple capacitively said grid to said cathode, and an annular member slidable upon said cathode conductor to vary the effective electrical length of said cathode conductor to tune said cathode conductor and acting through said capacitive coupling to tune said grid conductor.

5. A grid-cathode type re-enterant cavity oscillator comprising a high frequency electron tube having a cathode, a control grid and an anode, an outer cylindrical conductor connected to said anode and having conductive end plates to form a resonant cavity, a first coaxial inner cylindrical conductor substantially one half wave length long connected to said grid, a second coaxial cylindrical inner conductor substantially one half wave length effective electrical length connected to said cathode, a third coaxial cylindrical inner conductor attached to said second coaxial cylindrical conductor at a predetermined distance from the end of said second conductor and extending within said first coaxial cylindrical conductor to couple capacitively said grid to said cathode, an annular member slidable upon said cathode conductor to vary the effective electrical length of said cathode conductor to tune said cathode conductor and acting through said capacitive coupling to tune said grid conductor, and means to indicate the position of said annular member.

References Cited in the file of this patent

UNITED STATES PATENTS

| Number | Name | Date |
|---|---|---|
| 2,285,662 | Hutcheson | June 9, 1942 |
| 2,408,355 | Turner | Sept. 24, 1946 |
| 2,411,424 | Gurewitsch | Nov. 19, 1946 |
| 2,506,733 | Norgaard | May 9, 1950 |
| 2,525,452 | Gurewitsch | Oct. 10, 1950 |
| 2,605,421 | Schultz et al. | July 29, 1952 |